United States Patent
Teillet et al.

(10) Patent No.: US 8,036,627 B2
(45) Date of Patent: Oct. 11, 2011

(54) BIDIRECTIONAL FREQUENCY MIXER, RADIOFREQUENCY TRANSCEIVER SYSTEM INCLUDING SUCH A MIXER

(75) Inventors: Hervé Teillet, Maisons Alfort (FR); Yves Guillerme, Saclay (FR); Rafik Hassen-Khodja, Vaureal (FR)

(73) Assignee: Thales (FR)

( * ) Notice: Subject to any disclaimer, the term of this patent is extended or adjusted under 35 U.S.C. 154(b) by 810 days.

(21) Appl. No.: 12/126,816

(22) Filed: May 23, 2008

(65) Prior Publication Data

US 2009/0086658 A1  Apr. 2, 2009

(30) Foreign Application Priority Data

May 25, 2007 (FR) ...................... 07 03731

(51) Int. Cl.
*H04B 1/26* (2006.01)
*H04B 1/10* (2006.01)
(52) U.S. Cl. ........ 455/323; 455/326; 455/302; 455/313; 327/357
(58) Field of Classification Search .................. 455/313, 455/323, 326, 302, 304; 327/119, 335, 357
See application file for complete search history.

(56) References Cited

U.S. PATENT DOCUMENTS

| | | | | |
|---|---|---|---|---|
| 5,265,267 A * | 11/1993 | Martin et al. | ................. | 455/326 |
| 5,428,839 A * | 6/1995 | Friesen et al. | ................ | 455/326 |
| 5,590,412 A | 12/1996 | Sawai et al. | | |
| 5,590,413 A | 12/1996 | Kondratiev et al. | | |
| 5,740,528 A * | 4/1998 | Drennen | ........................ | 455/327 |
| 6,094,570 A * | 7/2000 | Consolazio | .................... | 455/327 |
| 6,226,509 B1 | 5/2001 | Mole et al. | | |
| 6,711,397 B1 * | 3/2004 | Petrov et al. | .................. | 455/324 |
| 6,738,611 B1 * | 5/2004 | Politi | ............................. | 455/302 |
| 6,999,746 B2 * | 2/2006 | Wang | ............................ | 455/323 |
| 7,013,122 B2 * | 3/2006 | Gamliel | ........................ | 455/330 |
| 7,084,693 B2 * | 8/2006 | Romano | ........................ | 327/355 |
| 7,783,250 B2 * | 8/2010 | Lynch | ................................ | 455/7 |
| 2007/0173209 A1 * | 7/2007 | Kim et al. | ........................ | 455/78 |

FOREIGN PATENT DOCUMENTS

JP  57-069939  4/1982

\* cited by examiner

*Primary Examiner* — Duc M Nguyen
(74) *Attorney, Agent, or Firm* — Lowe Hauptman Ham & Berner, LLP

(57) ABSTRACT

The present invention relates to a bidirectional frequency mixer, as well as a radiofrequency transceiver system including at least such a mixer. The mixer includes two ports separated in intermediate frequency FI, one for the reception, the other for the emission and a common port in frequency RF both for reception and for emission. It also includes at least fours mixing cells and three phase shifting means of signals used to remove the undesirable frequencies generated by the mixing cells. The mixer enables a rejection of the frequencies produced by a local oscillator in transmitting phase and a rejection of the image phase in receiving phase to be preformed. The invention is in particular applicable to designing microwave integrated circuits, in particular in millimetric frequency band.

7 Claims, 4 Drawing Sheets

BIDIRECTIONAL FREQUENCY MIXER, RADIOFREQUENCY TRANSCEIVER SYSTEM INCLUDING SUCH A MIXER

RELATED APPLICATIONS

The present application is based on, and claims priority from, French Application Number 07 03731, filed May 25, 2007, the disclosure of which is hereby incorporated by reference herein in its entirety.

FIELD OF THE INVENTION

The present invention relates to a bidirectional frequency mixer, as well as a radiofrequency transceiver system including such a mixer. In particular, it is applicable to designing microwave integrated circuits, in particular in millimetric frequency band.

BACKGROUND OF THE INVENTION

The radiofrequency communication systems generally include receiving and transmitting devices such as antennas, a processing unit as well as an interface enabling signals to be exchanged between the transceiver devices and the processing unit.

On one hand, to make processable by a processing unit a signal received by the receiving/transmitting device, and on the other hand, to allow to transmit a signal produced by the processing unit, the receiving and transmitting functions generally comprise amplification, filtering, mixing and modulation/demodulation steps. The mixers are, among other things, used to translate high frequency signals to lower frequency bands in order to make the processing easier. In particular, the use of some filters, calculators or demodulators sometimes requires operating at less high frequencies, called intermediate frequencies.

One of the problems encountered with the communication systems is the simultaneous transmission/reception, or at least the transmission/reception in half-duplex mode. In particular, a further difficulty arises with using mixers. Indeed, there occurs undesirable frequency signals produced upon mixing, whether in receiving phase or in transmitting phase.

In order to address these problems, it is known to use a signal transmitting string separated from a receiving string, as shown in FIG. 1. Each of these processing strings then includes its own components and can operate without disturbing the attendant string significantly. Such a structure has in particular the drawback to raise the cost and the size of the circuit. In particular, at least two mixers 5, 7 are required, one for the receiving phase that converts the high frequency signals to an intermediate frequency and the other for the transmitting phase that converts the signals from the processing unit in a higher frequency. In a millimetric frequency band, these elements can in particular be integrated on a microwave integrated circuit further called MMIC according to the Anglo-Saxon acronym "Monolithic Microwave Integrated Circuit". However, the number and the size of the components to be integrated on this type of circuits is a crucial criterion to be taken into account in the designing phase.

FIG. 1 presents a radiofrequency transceiver system according to the prior art. The system 1 includes an antenna 2, a switching device 3, a processing unit 4, a local isolator 5 and two mixers 6 and 7.

In receiving phase, a signal $S_{RF}$ of frequency RF picked up by the antenna 2 is transmitted by the switching device 3 towards a first input 6a of the first mixer 6. By combining a signal $S_{RF}$ with a signal of frequency $F_{OL}$ provided on a second input 6b by the local oscillator 5, the first mixer 6 produces a signal $S_{FI}$ on an output 6c at an intermediate frequency compatible with the operation of the processing unit 4.

In transmitting phase, the processing unit 4 provides on a first input 7c of the second mixer 7 a signal $S_{FI}$ of frequency FI. By combining the signal $S_{FI}$ with a signal of frequency $F_{OL}$ provided by the local oscillator 5 on the second input 7b, the second mixer 7 produces on an output 7c a signal $S_{RF}'$ of frequency RF. The signal $S_{RF}'$ is then transmitted by the switching device 3 to the antenna 2 that can transmit it.

SUMMARY OF THE INVENTION

It is an object of the invention to use in particular a single mixer common to the transmitting and receiving strings performing a rejection of the undesirable frequencies in receiving phase and in transmitting phase. To that end, it is an object to the invention to provide a bidirectional signal mixer adapted to operate according to two modes:
  a reception mode, combining a radioelectric signal $S_{RF+IM}$ comprising a frequency component RF and an image component frequency IM with a signal $S_{FOL}$ of frequency $F_{OL}$ to produce a signal $S_{FI}$ of intermediate frequency FI,
  an emission mode, combining a signal $S_{FI}$ of intermediate frequency FI with a signal $S_{FOL}$ of frequency $F_{OL}$ to produce a radioelectric signal $S_{RF}$,
  the mixer comprising at least:
  four mixing cells, each being adapted to combine two signals to produce an output signal converted in frequencies with respect to the first of the two signals,
  a first phase shifting means adapted to dispatch the signal $S_{FOL}$ on each mixing cell,
  a second phase shifting means adapted, in the reception mode, to dispatch the power of the signal $S_{RF+IM}$ on each mixing cell,
  a third phase shifting means adapted, in the reception mode, to combine the signals from said mixing cells to produce a signal $S_{FI}$ free from a frequency component IM, the combined signals comprising image frequency components IM in opposite phase and frequency components FI in phase,
  the third shifting means being also adapted, in the emission mode, to dispatch the power of the signal $S_{FI}$ on each mixing cell and the second phase shifting means being also adapted, in the emission mode, to combine the signals from said mixing cells to produce a radioelectric signal $S_{RF}$ free from the frequency component $F_{OL}$, the combined signals comprising frequency components $F_{OL}$ in opposite phase and frequency components RF in phase. Preferably, the shift means work in analogue mode.

According to one embodiment, the first phase shifting means comprises at least one coupler adapted to dispatch the power of an input signal onto two output signals, the first output signal $S_{FOL}^{90°}$ being phase shifting with respect to the second output signal $S_{FOL}^{0°}$.

The first phase shifting means can comprise a power divider and two couplers, said divider dispatching the power of the signal $S_{FOL}$ on one input of each coupler, each coupler dispatching the power of its incoming signal onto two output signals, the first output signal $S_{FOL}^{90°}$ being phase shifting with respect to the second output signal $S_{FOL}^{0°}$.

The second phase shifting means can comprise at least three couplers a first input-output of the first coupler being connected to one input-output of the second coupler, and a second input-output of the first coupler being connected to one input-output of the third coupler, the second and third couplers being connected to the mixing cells, in order:

to dispatch, at the output of the second and third couplers, the power of the signal $S_{RF+IM}$ received by an input-output of the first coupler, and/or to combine the signals received by the second and third couplers to produce a signal $S_{RF}$ on a input-output of the first coupler.

The third phase shifting means can comprise at least three couplers a first input-output of the first coupler being connected to one input-output of the second coupler, and a second input-output of the first coupler being connected to one input-output of the third coupler, the second and third couplers being connected to the mixing cells, in order:

to dispatch, at the output of the second and third couplers, the power of the signal $S_{RF+IM}$ received by an input-output of the first coupler, and/or to combine the signals received by the second and third couplers to produce a signal $S_{RF}$ on a input-output of the first coupler.

The invention also relates to a method for implementing a bidirectional signal mixer as described above, comprising the following steps of:

combining, for a period of time Δt1, an input signal of frequency RF with an input signal of frequency $F_{OL}$ in order to produce at the output a signal of frequency FI, combining, for a period of time Δt2, time offset with respect to Δt1, an input signal of frequency FI with an input signal of frequency $F_{OL}$ in order to produce at the output a signal of frequency RF.

The invention also relates to a radiofrequency transceiver system comprising at least one bidirectional mixer comprising the features described above.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWING

The present invention is illustrated by way of example, and not by limitation, in the figures of the accompanying drawings, wherein elements having the same reference numeral designations represent like elements throughout and wherein Other features and advantages will become apparent to the reader from the illustrative unrestricted detailed description that follows with respect to the appended drawings in which.

DETAILED DESCRIPTION OF THE DRAWING

Figure 1:
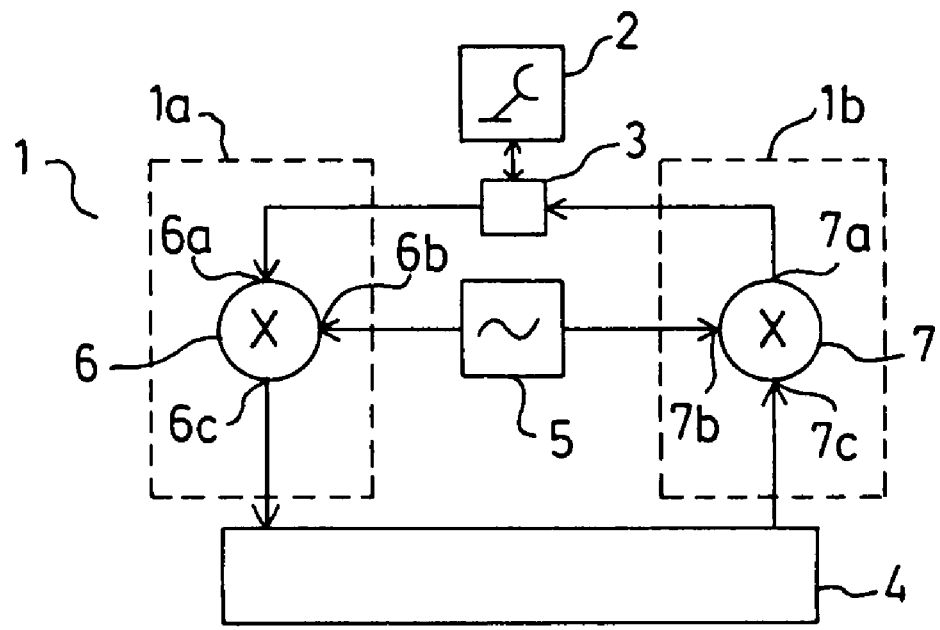
FIG. 1 shows a radiofrequency transceiver system according to the prior art, the figure having already being presented.
Figure 2:
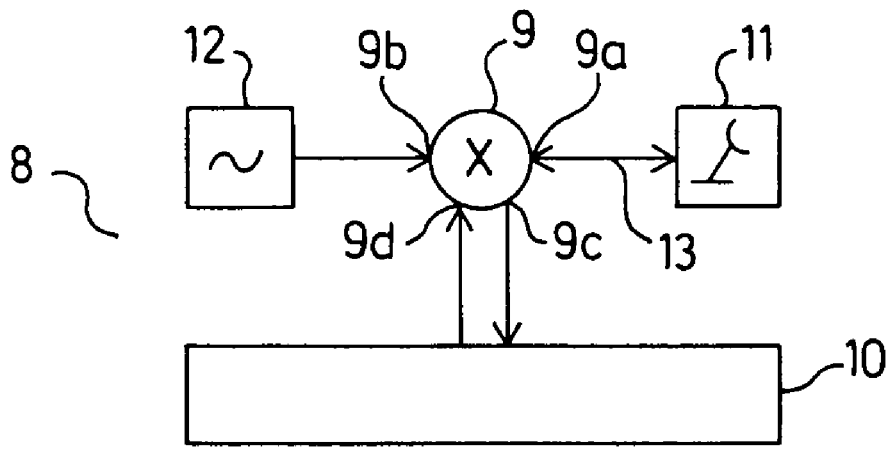
FIG. 2 shows a radiofrequency transceiver system including a bidirectional frequency mixer according to the invention.

FIG. 2 shows a transceiver system of a bidirectional mixer 9, according to the invention, enabling signals in receiving phase and in transmitting phase to be converted.

A system 8, whose detailed operation is described below, operates according to a half-duplex mode. The system 8 includes the bidirectional mixer 9, a signal processor device 10, an antenna 11 and a local oscillator 12 providing a translation frequency. The mixer 9 includes a first input 9b, a second input 9d, an input-output 9c and an output 9c. The system 9 operates as described below for example.

During a period of time Δt1, the system 8 operates in receiving mode, that is the antenna 11 picks up outside signals. These signals are transmitted to the mixer 9, and then to the processing unit 10. When the period Δt1 is completed, the antenna 11 switches in transmitting mode for a period Δt2, for example. The mixer 9 does not necessary include a switching device to move from one mode to the other. The presence or the absence of signals on the input-output 9a is sufficient to define the operating mode for example. The signals from the processing unit 10 are then transmitted to the mixer 9 and then to the antenna 11 that transmits. When the period Δt2 is completed, the antenna 11 switches again into the receiving mode for a period Δt2 and the cycle starts again.

The mixer 9 is said bidirectional as it can proceed to a frequency translation in both directions, that is it converts signals from one frequency A to a frequency B and from the frequency B to the frequency A.

In receiving phase, the bidirectional mixer 9 receives on the input-output 9a a signal $S_{RF}$ of frequency RF from the device of the antenna 11, and on the first input 9b, a signal $F_{OL}$ of frequency Fol produced by the local oscillator 12. The role of the mixer 9 is then to convert the signal $S_{RF}$ to a signal $S_{FI}$ delivered by the output 9c, of reduced intermediate frequency FI equal to |RF−Fol|. For example, a mixer can be used in a radiofrequency transmitter/receiver, which receives a carrier wave at a frequency RF equal to 40 Ghz and should translate this signal at an intermediate frequency FI equal to 5 Ghz. In this case, the local oscillator delivers a signal frequency RF−FI equal to 35 GHz of a signal frequency RF+FI equal to 45 Ghz. In the exemplary embodiment presented in this description, the translation frequency Fol is selected to be lower than RF and consequently Fol=RF−FI.

However, the input signal $S_{RF}$ can be noisy. In particular, it can contain a parasitic frequency component at the frequency IM equal to Fol−Fi, commonly called the image frequency by those skilled in art. As the mixer 9 acts on a wide band of the frequency spectrum, this noise $S_{IM}$ at the frequency IM can be translated at the frequency |IM−Fol| equal to FI and disturb the signal from the output 9c by adding to the wanted signal. A mixer 9 according to the invention performs a rejection of the image frequency IM and the signal from the output 9c is then composed of two main frequency components: FI and Fol. The undesirable frequency Fol can be readily filtered because it is generally much higher than FI.

In transmitting phase, the mixer 9 receives on the second input 9d a signal $S_{FIT}$ of frequency FI and on the first input 9b a signal $S_{FOL}$ Of frequency Fol that can be produced by the same local oscillator 12 as for the receiving phase. The role of the mixer 9 is then to convert the signal $S_{FIT}$ to a signal of higher frequency RF outgoing on the input-output 9a. The antenna 11 then emits this signal.

The mixer 9 uses a signal $S_{Fol}$ that has generally a strong power in order to perform a frequency translation for the emission. As described hereinafter, a mixer can transmit at the output a portion of the power at the input frequencies. However, it is to be avoided to transmit the component Fol by the input-output 9a because Fol is relatively close to RF, and the closer it is to the RF smaller FI is, it would be then difficult to remove this frequency Fol by filtering. According to a method described hereinafter in relation to FIG. 3, the mixer 9 proceeds consequently to a rejection of the frequency Fol and the signal from the input-output 9a is then composed of the single frequency component RF.

According to another embodiment, the system 8 includes two antennas, a first for the emission and a second for the reception of signals. In that case, the link 13 can be split, for example with a power divider, an input of the power divider being connected to the first antenna and another input being connected to the second antenna. This embodiment is not shown in the figures.

Filtering or amplifying means, not represented herein, can also be placed on the ways connecting the mixer 9 to other elements 10, 11 and 12 of the system 8.

Figure 3:
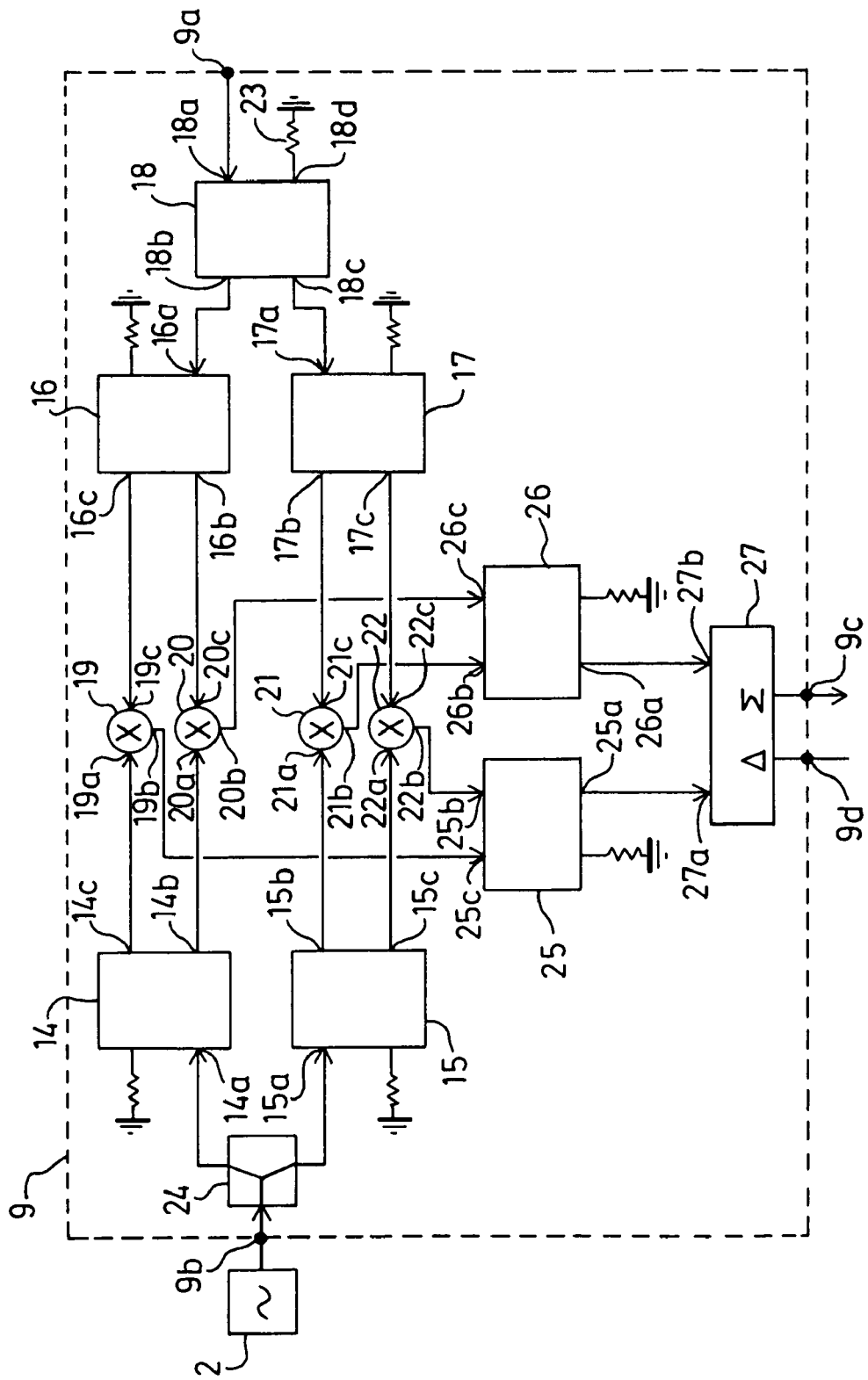
FIG. 3 shows an exemplary embodiment of a mixer according to the invention with arrowed marks on the propagation directions of the signals corresponding to the receiving phase.

FIG. 3 shows an exemplary embodiment of the invention with arrowed marks representing the propagation directions of the signals corresponding to the receiving phase.

The bidirectional mixer 9 can be made by using passive elements such as a first coupler 14, a second coupler 15, a third coupler 16, a fourth coupler 17, a fifth coupler 18, a sixth coupler 25, a seventh coupler 26 and a eighth coupler 27 but also with active elements such as a first mixing cell 19, a second mixing cell 20, a third mixing cell 21 and a fourth mixing cell 22.

The fifth coupler 18 includes a first input-output 18a, a second input-output 18b, a third input-output 18c, and a fourth input-output 18d. The signal incoming from the first input-output 18a is power dispatched on the inputs-outputs 18b and 18c. On the third input-output 18c, the signal is outputted with a phase shifting of 90° whereas when it is transmitted directly and thus without phase shifting to the second input-output 18b. The fourth input-output 18d is simply connected to a resistive load 23. The other couplers 14, 15, 16, 17, 25 and 26, except for the eighth coupler 27, operate the same way by performing a phase shifting of 90°. The eighth coupler 27 includes four inputs-outputs, a first input-output 27a, a second input-output 27b, a third input-output 9c and a fourth input-output 9d. When two signals enter by the first input-output 27a and the second input-output 27b, respectively, their powers are combined to be outputted on the third input-output 9c. When the signal is received by the fourth input-output 9c, it is power dispatched on the first and second inputs-outputs 27a, 27b. The signal coming then from the first input-output 27a is phase shifted of 180° whereas the signal from the second input-output 27b is not phase shifted.

A first mixing cell 19 includes a first port 19a, a second port 19b and a third port 19c. Its function is in particular to combine two input signals of respective frequencies A and B to produce a signal at the output including the following frequency component A, B, A+B and |A−B|. These are the frequency components A+B and |A−B| that are useful, because these are what enables an input frequency to be translated to the lower frequency, for example for reception, or higher, for example for emission. The undesirable components can for example be filtered at the output. Within the operation described herein, the first port 19a remains an input whereas the two other ports 19b and 19c operate in opposition and become alternatively an input or an output of the cell 19 depending on whether the mixer 9 is in receiving or transmitting mode. The other mixing cells 20, 21 and 22 described below operate the same way.

In receiving phase, the input signal $S_{RF}$ goes through the fifth coupler 18 that generates a signal $S_{RF}^{90°}$, of the same frequency, phase shifted of 90° on its third input-output 18c, whereas its second input-output 18b produces a signal $S_{RF}^{0°}$ of the same frequency and of the same phase as $S_{RF}$. On the other hand, the input signal $S_{RF}$ can contain noises about the image frequency IM=Fol−FI. A noise $S_{IM}$ on this frequency is potentially troublesome because it is translated by a mixing cell to the intermediate frequency FI, causing then interference to the wanted signal. A noisy signal $S_{RF}+S_{IM}$ is consequently transmitted into the first coupler 18 and the signals $S_{RF}^{0°}+S_{IM}^{0°}$ and $S_{RF}^{90°}+S_{IM}^{90°}$, exit from this coupler by its second 18b and its third input-output, respectively. According to the same principle, the signals $S_{RF}^{0°}+S_{IM}^{0°}$ and $S_{RF}^{90°}+S_{IM}^{90°}$, go through the third and fourth coupler 16 and 17 respectively via the first inputs-outputs 16a and 17a to undergo a phase shifting of 90°. Thus, the second and third inputs-outputs 16c, 16b, 17b and 17c of the third and fourth couplers 16 and 17 all produce a signal of the noisy frequency RF, but each with their own phase shifting. The signals $S_{RF}^{90°}+S_{IM}^{90°}$ from the third input-output 16c of the third coupler 16 and of the second input-output 17b of the fourth coupler 17 are phase shifted of 90°, the signals $S_{RF}^{90°}+S_{IM}^{90°}$ from the second input-output 16c of the third coupler 16 is not phase shifted and the signal $S_{RF}^{180°}+S_{IM}^{180°}$ from the third input-output 17c of the fourth coupler 17 is phase shifted of 180°.

Likewise, the signal $S_{FOL}$ produced by the local oscillator 12 is transmitted to the first and second couplers 14 and 15 after going through a power divider 24 to dispatch the signal to their first two inputs-outputs 14a and 15a. According to the same principle as for the third and fourth couplers 16 and 17, the signals exiting from the first and second couplers 14 and 15 are of the same frequency Fol but of different phases. The signals $S_{FOL}^{90°}$, from the third inputs-outputs 14c and 15c of the first and second couplers 14 and 15 are phase shifted of 90° whereas the signals $S_{FOL}^{90°}$ from the second inputs-outputs 14b and 15b of the first and second couplers 14 and 15 are not phase shifted.

According to another embodiment, the signals $S_{FOL}^{0°}$ and $S_{FOL}^{90°}$, produced at the output of the first and second couplers 14 and 15 are produced by using a single coupler receiving the signals $S_{FOL}$ produced by the local oscillator 12. A power divider is then placed at each of both outputs of said coupler to dispatch the power of the two signals $S_{FOL}^{0°}$ and $S_{FOL}^{90°}$, into four signals of substantially equal powers. These four signals are then dispatched at the output so as to present successively the same phase shifting as those produced by the previous embodiment, implying two couplers.

The signals entering the first and third ports (19a and 19c) (20a and 20c), (21a and 21c), (22a and 22c) of each mixing cell 19, 20, 21 and 22 produce the following combinations:
$S_{FOL}^{90°}$ with $S_{RF}^{90°}+S_{IM}^{90°}$ on the first mixing cell 19,
$S_{FOL}^{0°}$ with $S_{RF}^{0°}+S_{IM}^{0°}$ on the second mixing cell 20,
$S_{FOL}^{0°}$ with $S_{RF}^{90°}+S_{IM}^{90°}$, on the third mixing cell 21,
$S_{FOL}^{90°}$ with $S_{RF}^{180°}+S_{IM}^{180°}$ on the fourth mixing cell 22.

According to the operation of the mixing cell described above, the frequency component at the output of the mixing cell are: Fol, RF, IM, RF+Fol, IM+Fol, and FI=RF−Fol=Fol−IM. The components Fol, RF, IM, and RF+Fol are undesirable but can be readily filtered subsequently because these frequencies and FI deviate strongly. To be more clear, these components although potentially present in the frequency spectrum, will thus be ignored in the following of the description. The frequency component FI comes from both RF−Fol and Fol−IM, accordingly the frequency spectrum at the output is subjected to interference by a signal created by the translation of the frequency IM. This parasitic signal must then be removed.

A signal $S_{FI}^{90°}$, of frequency FI from the second port 21b of the third mixing cell 21 is the product of the translation of the signal $S_{RF}^{90°}$, phase shifted of 90° and of frequency RF by the signal $S_{FOL}^{0°}$ of frequency Fol. The noise $S_{IM}^{90°}$ of image frequency IM is also translated into the signal $S_{FI/IM}^{-90°}$ of frequency FI. However, this signal $S_{FI/IM}^{-90°}$ is in opposite phase with respect to the signal $S_{FI}^{90°}$ from the component RF. Let us remind that IM=Fol−FI and thus that IM−Fol=−FI whereas RF−Fol=FI. At the output of the second port 21b of the third mixing cell 21, there is thus a signal of frequency FI $S_{FI}^{90°}+S_{FI/IM}^{-90°}$. In a similar mode, the fourth cell 22 processes input signals $S_{FOL}^{90°}$, and $S_{RF}^{180°}+S_{IM}^{180°}$ mutually phase shifted of 90°, accordingly the signal from the second port 22b of the fourth mixing cell 22 is the same as that from 21b. For the first and second cells 19 and 20, the input signals $S_{FOL}^{90°}$, and $S_{RF}^{90°}+S_{IM}^{90°}$, on the one hand, and $S_{RF}^{0°}+S_{IM}^{0°}$ on the other hand, are not phase shifted between each other. At the outputs of the second ports 19b and 20b of the first and second mixing cells, there are consequently the non phase shifted signals $S_{FI}^{0°}+S_{FI/IM}^{0°}$.

The signals from the second ports 19b and 22b of the first and fourth mixing cells 19 and 22 are combined again and the sixth coupler 25 and the signals from the second ports 20b and 21b of the second and third mixing cells 20 and 21 are combined again in the seventh coupler 26.

Thus, the sixth coupler 25 receives the signal $S_{FI}^{0°}+S_{FI/IM}^{0°}$ from the second port 19b of the first mixing cell by its third input-output 25c and it receives the second signal $S_{FI}^{90°}+S_{FI/IM}^{-90°}$ from the second port 22b of the fourth mixing cell by its second input-output 25b. Likewise, the signal $S_{FI}^{0°}+S_{FI/IM}^{0°}$ from the second port 20b of the second mixing cell 20 enters the seventh coupler 26 through its third input-output 26c and the signal $S_{FI}^{90°}+S_{FI/IM}^{-90°}$ from the second port 21b of the third mixing cell enters by its second input-output 26b. The signals entering by the third input-output 25c and 26c of the sixth and seventh couplers are phase shifted of 90°. Thus, the following combinations are performed:

For the sixth coupler 25, $S_{FI}^{0°+90°}+S_{FI/IM}^{0°+90°}$ (third input-output 25c phase shifted) with $S_{FI}^{90°}+S_{FI/IM}^{-90°}$ (second input-output 25b non phase shifted), For the seventh coupler 26, $S_{FI}^{0°+90°}+S_{FI/IM}^{0°+90°}$ (third input-output 26c phase shifted) with $S_{FI}^{90°}+S_{FI/IM}^{-90°}$ (second input-output 26b non phase shifted).

The powers between the inputs are substantially equally dispatched, consequently it is the signal $S_{FI}^{0°+90°}+S_{FI/IM}^{0°+90°}+S_{FI}^{90°}+S_{FI/IM}^{-90°}=S_{FI}^{90°}$ that exits from the first input-output 25a of the sixth coupler with a power output twice as that of the signal $S_{FI}^{90°}$, entered by the second input-output 25b of the sixth coupler, this because of the combination of two signals entered by the second and third inputs-outputs 25b and 25c. As the seventh coupler 26 applies the same operation as the coupler 25 on signals of identical input, a signal $S_{FI}^{90°}$, also exits from the first input-output 26a of the sixth coupler. The signals $S_{FI/IM}$ when removed with the recombination of signals of substantially the same power $S_{FI/IM}^{90°}$ and $S_{FI/IM}^{-90°}$ in opposite phase. The mixer 9 thus proceeds to a rejection of the image frequency during the receiving phase.

Finally, the signals $S_{FI}^{90°}$ from the first inputs-outputs 25a and 26a of the sixth and seventh couplers are combined again in the eighth coupler 27. These two signals are received by the first and second inputs-outputs 27a and 27b of the eighth coupler and combine to exit on the output 9c of the mixer 9.

To sum up, the signal $S_{RF}+S_{IM}$ entering on the input-output 9a of the mixer 9 combined with the signal $S_{FOL}$ entering on the first input-output 9b of the mixer 9 produces a signal $S_{FI}^{90°}$ exiting on the output 9c of the mixer 9. frequency components Fol, RF and RF+Fol from mixing cells 19, 20 21, 22, then transmitted at the output 9c, can then be readily filtered because these frequencies and FI deviate strongly.

The phase shifts are applied with three groups of couplers. A first group consisting in the first and the second couplers (14, 15) is the first means enabling the signals from the local oscillator 12 to be phase shifted. A second group, consisting in the third, the fourth and the fifth couplers (16, 17, 18), is a second means enabling the signals of frequency RF to be phase shifted. A third group consisting in the sixth, the seventh and the eighth couplers (25, 26, 27) is a third means enabling the second frequency FI to be phase shifted.

Figure 4:
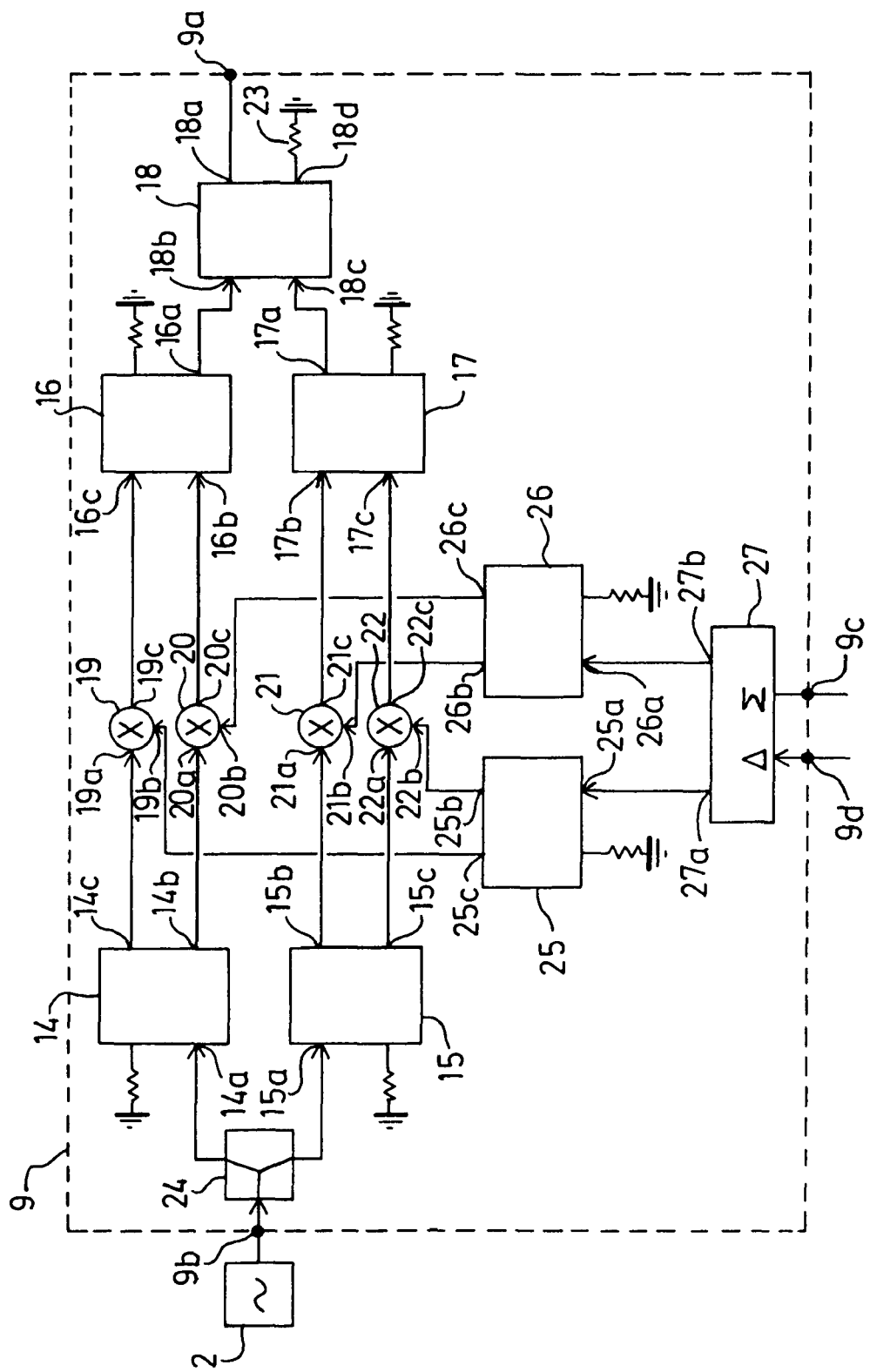
FIG. 4 shows an exemplary embodiment of a mixer according to the invention with arrowed marks on the propagation directions of the signals corresponding to the transmitting phase.

FIG. 4 presents an exemplary embodiment of the invention with arrowed marks on the propagation directions of the signals corresponding to the transmitting phase.

During this phase, a signal $S_{FI}$ is addressed to the mixer by its second input 9d. The eighth coupler 27 then dispatches the signal $S_{FI}$ on its first and second inputs-outputs 27a and 27b. The signal $S_{FI}^{180°}$ from the first input-output 27a of the eighth coupler 27 is phase shifted of 180° with respect to the input signal $S_{FI}$, whereas the signal $S_{FI}^{0°}$ from the second input-output 27b of the eighth coupler 27 is not phase shifted. The signal $S_{FI}^{180°}$ goes then through the sixth coupler 25 via its first input-output 25a and the signal $S_{FI}^{0°}$ enters the seventh coupler 26 by its first input-output 26a. When the signals $S_{FI}^{180°}$ and $S_{FI}^{0°}$ have gone through these two couplers 25 and 26, each of them is divided again into two signals. The signals $S_{FI}^{180°}$ and $S_{FI}^{0°}$ coming from the second inputs-outputs 25b and 26b of the sixth and the seventh couplers 25 and 26 are not phase shifted whereas the signals $S_{FI}^{-90°}$ and $S_{FI}^{90°}$, coming from the third inputs-outputs 25c and 26c of the sixth and seventh couplers respectively are phase shifted of 90°. As previously described in the receiving phase, the sixth and seventh couplers 25 and 26 are connected to the mixing cells 19, 20, 21, 22. The initial signal $S_{FI}$ switching the second input-output 9d of the mixer 9 is thus dispatched on the second ports 19b, 22b, 21b, 20b of the mixing cells 19, 22, 21, 20 with a phase difference of 90° in between each successive way:

on the second port 19b of the first mixing cell 19, a signal $S_{FI}^{-90°}$ of frequency FI phase shifted of −90°, on the second port 22b of the fourth mixing cell 22, a signal $S_{FI}^{180°}$ of frequency FI phase shifted of 180°, on the second port 21b of the third mixing cell 21, a signal $S_{FI}^{0°}$ of frequency FI not phase shifted of, on the second port 20b of the second mixing cell 20, a signal $S_{FI}^{90°}$, of frequency FI phase shifted of 90°.

In parallel, the local oscillator delivers, as for the receiving phase, a signal $S_{FOL}$ of frequency Fol that is transmitted and phase shifted by the first and second couplers 14 and 15. Each mixing cell then receives two signals of frequencies FI and Fol, but each with a different combination of phases. Indeed, the first mixing cell 19 combines $S_{FI}^{-90°}$ on the second port 19b with $S_{FOL}^{90°}$, on the first port 19a, the second mixing cell 20 combines $S_{FI}^{90°}$, on the second port 20b with $S_{FOL}^{0°}$ on the first port 20a, the third mixing cell 21 combines $S_{FI}^{0°}$ on the second port 21b with $S_{FOL}^{0°}$ on the first port 21a, the fourth mixing cell 22 combines $S_{FI}^{180°}$ on the second port 22b with $S_{FOL}^{90°}$, on the first port 22a.

According to the operation of a mixing cell described above, the frequency components at the output of the mixing cells are FI, Fol, IM=Fol−FI, and RF=FI+Fol. The components FI, Fol, and IM are undesirable. The component FI can be readily filtered subsequently because FI and RF deviate strongly, it will thus be ignored in the following of the description. On the other hand, the components Fol and IM are potentially close enough to RF to both in particular a pass-band filtering about RF. Therefore, they must be removed.

Thus, at the output of the mixing cell, there is obtained:
on the third port $19c$ of the first mixing cell $19$, $S_{FI+Fol}^{-90°+90°}+S_{Fol-FI}^{90°-(-90)°}+S_{Fol}^{90°}=S_{RF}^{0°}+S_{IM}^{180°}+S_{Fol}^{90°}$,
on the third port $20c$ of the second mixing cell $20$, $S_{FI+Fol}^{90°+0°}+S_{Fol-FI}^{0°-90°}+S_{Fol}^{0°}=S_{RF}^{90°}+S_{IM}^{-90°}+S_{Fol}^{0°}$,
on the third port $21c$ of the third mixing cell $21$, $S_{FI+Fol}^{0°+0°}+S_{Fol-FI}^{0°-0°}+S_{Fol}^{0°}=S_{RF}^{0°}+S_{IM}^{0°}+S_{Fol}^{0°}$,
on the third port $22c$ of the fourth mixing cell $22$, $S_{FI+Fol}^{180°+90°}+S_{Fol-FI}^{90°-180°}+S_{Fol}^{90°}=S_{RF}^{-90°}+S_{IM}^{-90°}+S_{Fol}^{90°}$.

According to the same principle as in the receiving phase, the signals are combined again in the third, the fourth and the fifth couplers $16$, $17$ and $18$.

The signal $S_{RF}^{0°}+S_{IM}^{180°}+S_{Fol}^{90°}$, exiting the third port $19c$ of the first mixing cell $19$ is transmitted to the third coupler $16$ via its third input-output $16c$ and is phase shifted of $90°$. The signal $S_{RF}^{90°}+S_{IM}^{-90°}+S_{Fol}^{0°}$ exiting the third port $20c$ of the second mixing cell $20$ is not phase shifted. The third coupler $16$ thus proceeds to the following combination: $(S_{RF}^{0°+90°}+S_{IM}^{180°+90°}+S_{Fol}^{90°+90°})+(S_{RF}^{90°}+S_{IM}^{-90°}+S_{Fol}^{0°})$ and the signal from the first input-output $16a$ of the third coupler $16$ is thus $S_{RF}^{90°}+S_{IM}^{90°}$, with the power substantially equal to the sum of the input powers. The component Fol has been removed with the combination of signals in opposite phase of substantially equal powers $S_{Fol}^{180°}$ and $S_{Fol}^{0°}$. The same principle proceeds in the fourth coupler $17$ with the following combination: $(S_{RF}^{0°}+S_{IM}^{0°}+S_{Fol}^{0°})+(S_{RF}^{-90°+90°}+S_{IM}^{-90°+90°}+S_{Fol}^{90°+90°})$. The signal from the first input-output $17a$ of the third coupler $17$ is thus $S_{RF}^{0°}+S_{IM}^{0°}$, with the power substantially equal to the sum of the input powers. Once more, the combination of input signals results in a rejection of the frequency Fol at the output.

The two signals form the first two inputs-outputs $16a$, $17a$ of the third and fourth couplers $16$ and $17$ are then combined again in the fifth coupler $18$ by going through the second and third inputs-outputs $18b$ and $18c$ respectively. The following combination is then performed:
$(S_{RF}^{90°}+S_{IM}^{-90°})+(S_{RF}^{0°+90°}+S_{IM}^{0°+90°})$. As the powers of the second and third inputs-outputs $18b$ and $18c$ of the fifth coupler $18$ are substantially equivalent, the fifth coupler $18$ proceeds to a rejection of the image frequency by combining the two component $S_{IM}^{-90°}$ and $S_{IM}^{90°}$ in opposite phase. The signal from its first input-output $18a$ is thus $S_{RF}^{90°}$.

To sum up, the signal $S_{IF}$ entering the second input $9d$ of the mixer $9$ combined with the signal $S_{FOL}$ entering on the first input $9b$ of the mixer $9$ produces the signal $S_{RF}^{90°}$ exiting on the input-output $9a$ of the mixer $9$. The frequency components Fol and IM coming from the mixing cells are thus removed with judicious combinations of signals in opposite phase. The frequency FI coming from mixing cells and transmitted in the input-output $9a$ can be readily filtered because RF and FI deviate strongly.

According to another embodiment, the local oscillator $12$ can deliver a frequency Fol equal to RF+FI. In that case, the frequency translation performed by the mixer enables, once more, a signal of frequency FI to be obtain at the output, but the image frequency to remove is equal to Fol+Fi and not to FI anymore. The architecture of the mixer remains valid in this alternative. Indeed, for the signal RF to go through the first input-output $18d$, the couplers should simply be adapted to the frequency Fol and the connections to the first and the fourth inputs-outputs $18d$ and $18a$ of the fifth coupler should be switched. Preferably, a frequency Fol equal to RF−FI is chosen because it is generally easier to deal with small frequencies.

It is an advantage of the invention to directly proceed to the rejection of images directly in the mixer. This avoids adding a filter, always to the detriment of the size of the circuit and sometimes even impossible to integrate on an MMIC.

It is another advantage of the invention to give to the mixer a larger linearity of power. Indeed, each mixing cell is susceptible to the saturation phenomenon of the output power when the input power becomes too large and, therefore, loses its linear feature. Each mixing cell is in particular characterized by its output power at the 1 dB compression point. Let us remind that the 1 dB compression point is, on a curve representing the output power as a function of the input power, the point for which the deviation between the output power and its linear extrapolation is 1 dB. A mixer including four mixing cells $19$, $20$, $21$ and $22$ of the same 1 dB compression point in parallel has the 1 dB compression point higher than that of each of the cells taken separately, thanks to the recombination of the powers in the output couplers $25$, $26$ and $27$ downstream—in the reception mode—and in the couplers $16$, $17$ and $18$ upstream—in the emission mode.

Figure 5:
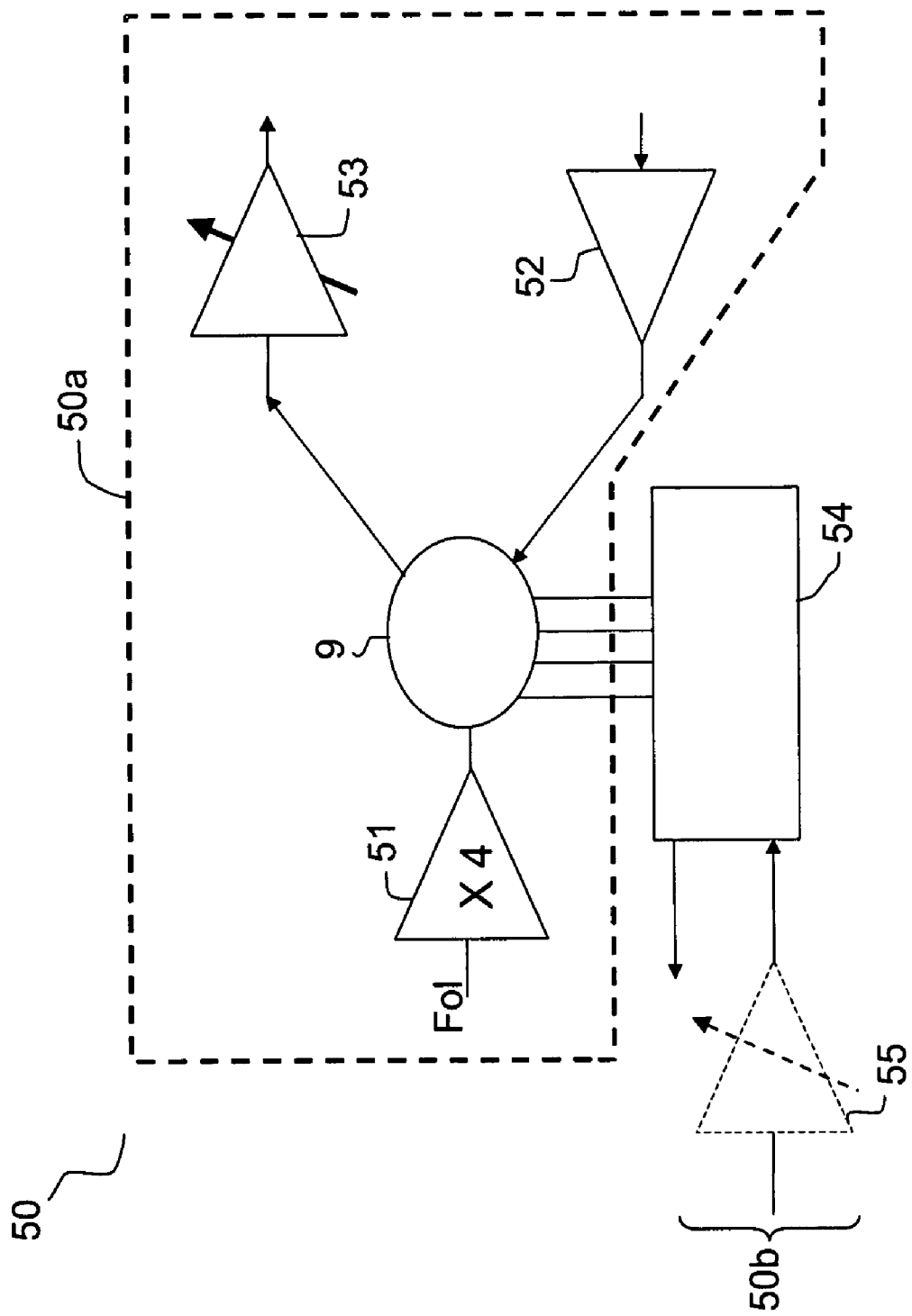
FIG. 5 shows an exemplary use of the mixer according to the invention.

FIG. 5 represents an exemplary circuit incorporating a single mixer for a millimetric range communication application.

The circuit $50$ includes a bidirectional frequency mixer $9$, a frequency multiplier $51$, a low noise amplifier $52$, a first voltage controlled amplifier $53$, a coupling component $54$ and a second voltage controlled amplifier $55$.

The circuit $50$ is composed of two main portions. The first portion $50a$ contains the mixer $9$, the low noise amplifier $52$, the first voltage controlled amplifier $53$ and the frequency multiplier $51$. The second portion $50b$ includes the coupling component $54$ and the second voltage controlled amplifier $55$.

The first portion $50a$ includes elements that operate at millimetric band frequencies, which enables this portion of the circuit to be integrated in the MMIC. The mixer $9$ is connected to the frequency multiplier $51$ receiving a signal produced by a local oscillator, connected to the low noise amplifier $52$ receiving an antenna signal, connected to the first voltage controlled amplifier $53$ enabling the signals to be transmitted to be amplified, and connected to the coupling component $54$. On the other hand, the coupling component $54$ receives signals at the intermediate frequency FI through the second voltage controlled amplifier $55$, and it also transmits signals at the frequency FI.

The coupling component $54$ comprises the sixth, seventh and eighth couplers $25$, $26$, $27$ operating at the intermediate frequency FI. In the described example, the frequency FI is equal to 5 Ghz. This frequency is too low to be able to position the too bulky, second portion $50b$ into an integrated circuit, for this reason, the constituting elements of the second portion $50b$ will be made, by way of example, from discrete components or lines divided on a printed circuit.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. Bidirectional signal mixer adapted to operate according to two modes,
   a reception mode, combining a radioelectric signal $S_{RF+IM}$ comprising a frequency component RF and an image component frequency IM with a signal $S_{FOL}$ of frequency $F_{OL}$ to produce a signal $S_{FI}$ of intermediate frequency FI,
   an emission mode, combining a signal $S_{FI}$ of intermediate frequency FI with a signal $S_{FOL}$ of frequency $F_{OL}$ to produce a radioelectric signal $S_{RF}$, the mixer comprising:
   four mixing cells, each being adapted to combine two signals to produce an output signal converted in frequencies with respect to the first of the two signals,
   a first phase shifting means adapted to dispatch the signal $S_{FOL}$ on each mixing cell,
   a second phase shifting means adapted, in the reception mode, to dispatch the power of the signal $S_{RF+IM}$ on each mixing cell,
   a third phase shifting means adapted, in the reception mode, to combine the signals from said mixing cells to produce a signal $S_{FI}$ free from a frequency component IM, combined signals comprising image frequency components IM in opposite phase and frequency components FI in phase,
   the third shifting means being also adapted, in the emission mode, to dispatch the power of the signal $S_{FI}$ on each mixing cell and the second phase shifting means being also adapted, in the emission mode, to combine the signals from the said mixing cells to produce a radioelectric signal $S_{RF}$ free from the frequency component $F_{OL}$, the combined signals comprising frequency components $F_{OL}$ in opposite phase and frequency components RF in phase.

2. The bidirectional signal mixer according to claim 1, wherein the first phase shifting means comprises at least one coupler adapted to dispatch the power of an input signal onto two outputs signals, the first output signal $S_{FOL}^{90°}$ being phase shifting with respect to the second output signal $S_{FOL}^{0°}$.

3. The bidirectional signal mixer according to claim 1, wherein the first phase shifting means comprises a power divider and two couplers, said divider dispatching the power of the signal $S_{FOL}$ on one input of each coupler, each coupler dispatching the power of its incoming signal onto two output signals, the first output signal $S_{FOL}^{90°}$ being phase shifting with respect to the second output signal $S_{FOL}^{0°}$.

4. The bidirectional signal mixer according to claim 1, wherein the second phase shifting means comprising at least three couplers, a first input-output of the first coupler being connected to one input-output of the second coupler, and a second input-output of the first coupler being connected to one input-output of the third coupler, the second and third couplers being connected to the mixing cells, in order:
   to dispatch, at the output of the second and third couplers, the power of the signals $S_{RF+IM}$ received by an input-output of the first coupler,
   and/or to combine the signals received by the second and third couplers to produce a signal $S_{RF}$ on an input-output of the first coupler.

5. The bidirectional signal mixer according to claim 1, wherein the third phase shifting means comprises at least three couplers, a first input-output of the first coupler being connected to one input-output of the second coupler, and a second input-output of the first coupler being connected to one input-output of the third coupler, the second and third couplers being connected to the mixed cells, in order:
   to dispatch, at the output of the second and third couplers, the power of the signal $S_{FI}$ received by an input-output of the first coupler,
   and/or to combine the signals received by the second and third couplers to produce a signal $S_{FI}$ on an input-output of the first coupler.

6. Method for mixing the signals which uses a bidirectional mixer according to claim 1 to perform at least the following steps of:
   combining, for a period of time $\Delta t1$, an input signal of frequency RF with an input signal of frequency Fol in order to produce at the output a signal of frequency FI,
   combining, for a period of time $\Delta t2$, time offset with respect to $\Delta t1$, an input signal of frequency FI with an input signal of frequency Fol in order to produce at the output a signal of frequency RF.

7. Radiofrequency transceiver system comprising at least one bidirectional signal mixer according to claim 1.

* * * * *